United States Patent
Itagaki et al.

(10) Patent No.: US 8,188,467 B2
(45) Date of Patent: May 29, 2012

(54) AMORPHOUS OXIDE AND FIELD EFFECT TRANSISTOR

(75) Inventors: Naho Itagaki, Yokohama (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/597,934

(22) PCT Filed: May 22, 2008

(86) PCT No.: PCT/JP2008/059852
§ 371 (c)(1), (2), (4) Date: Oct. 28, 2009

(87) PCT Pub. No.: WO2008/149754
PCT Pub. Date: Dec. 11, 2008

(65) Prior Publication Data
US 2010/0140611 A1    Jun. 10, 2010

(30) Foreign Application Priority Data
May 30, 2007    (JP) .................... 2007-143431

(51) Int. Cl.
*H01L 29/22*    (2006.01)
(52) U.S. Cl. .......... 257/43; 257/57; 257/E29.296; 257/E29.095; 257/347
(58) Field of Classification Search ............. 257/43, 257/57, E29.296, E29.095
See application file for complete search history.

(56) References Cited

U.S. PATENT DOCUMENTS

| | | | |
|---|---|---|---|
| 6,878,962 | B1 | 4/2005 | Kawasaki et al. ............... 257/43 |
| 2006/0108636 | A1* | 5/2006 | Sano et al. ..................... 257/347 |
| 2006/0113549 | A1 | 6/2006 | Den et al. |
| 2009/0072233 | A1 | 3/2009 | Hayashi et al. |

FOREIGN PATENT DOCUMENTS

| | | |
|---|---|---|
| JP | 2002-076356 | 3/2002 |
| WO | 2006/051993 A2 | 5/2006 |

OTHER PUBLICATIONS

G. Lavareda et al. "Transparent thin film transistors based on indium oxide semiconductor," Journal of Non-Crystalline Solids, vol. 352, pp. 2311-2314, 2006.
K. Nomura et al. "Room-Temperature fabrication of transparent flexible thin-film transistors using amorphous oxide semiconductors," Letters to Nature, vol. 432, pp. 488-492, Nov. 25, 2004.
Korean Office Action issued in the counterpart application No. 10-2009-7027135 dated Mar. 17, 2011—5 pages.
European Office Action issued in the counterpart application No. 08764821.8 dated Mar. 1, 2011—4 pages.

* cited by examiner

*Primary Examiner* — Marc Armand
(74) *Attorney, Agent, or Firm* — Fitzpatrick, Cella, Harper & Scinto

(57) ABSTRACT

In a field effect transistor, a channel layer of the field effect transistor is composed of an amorphous oxide including In, Zn, N and O, an atomic composition ratio of N to N and O (N/(N+O)) in the amorphous oxide is equal to or larger than 0.01 atomic percent and equal to or smaller than 3 atomic percent, and the amorphous oxide does not include Ga, or, in a case where the amorphous oxide includes Ga, the number of Ga atoms contained in the amorphous oxide is smaller than the number of N atoms.

8 Claims, 6 Drawing Sheets

AMORPHOUS OXIDE AND FIELD EFFECT TRANSISTOR

TECHNICAL FIELD

The present invention relates to an amorphous oxide (also called a noncrystalline oxide) or a field effect transistor using the amorphous oxide as a channel layer. Moreover, the present invention relates to a display apparatus in which an organic EL (electro-luminescence) or an inorganic EL using the field effect transistor is used as a light emitting element, and to a display apparatus which uses a liquid crystal.

BACKGROUND ART

In recent years, a semiconductor device which uses an amorphous oxide semiconductor thin film has attention. The thin film of this type can be deposited at low temperature, and has optical transparency in regard to visible light because an optical band gap thereof is large. For these reasons, a flexible transparent TFT (thin film transistor) or the like can be formed on a plastic substrate, a film substrate or the like.

For example, Japanese Patent Application Laid-Open No. 2002-076356 describes a technique concerning a TFT in which an oxide film including Zn—O as main components is used as a channel layer.

Further, "Nature, Vol. 432, 25 Nov. 2004 (488-492)" describes a technique concerning a TFT in which an amorphous oxide film including In, Zn and Ga and formed at room temperature is used as a channel layer.

Furthermore, "Journal of Non-Crystalline Solids, 352 (2006) 2311" describes that an oxide thin film including indium oxide as a main component and formed at room temperature is used as a channel layer (active layer) of a TFT.

Moreover, U.S. Patent Publication No. 2006/0108636 describes a TFT in which an amorphous oxide film including In, Zn and Ga and formed at room temperature is used as a channel layer. In addition, U.S. Patent Publication No. 2006/0108636 describes a technique concerning a TFT in which an impurity such as Li, Na, Mn, Ni, Pd, Cu, Cd, C, N, P or the like has been added to the channel layer.

In the TFT described in "Nature, Vol. 432, 25 Nov. 2004 (488-492)", although an S value is relatively large, i.e., about 2V/decade, field effect mobility is high, i.e., 6 $cm^2$/Vs to 9 $cm^2$/Vs. For this reason, it is expected that this TFT is applied to a channel matrix which is desired for a flat display apparatus using a liquid crystal, an electroluminescence or the like. However, according to the knowledge of the present inventors, in this TFT, the characteristic thereof significantly changes according to an atomic composition ratio (also called an atomic ratio, or an atomic composition percentage) of main component metal elements of an amorphous oxide film used as the channel layer.

On the other hand, U.S. Patent Publication No. 2006/0108636 describes that a carrier concentration is controlled by adding the impurity element to the channel layer, and the TFT having a large current on/off ratio is thus acquired. However, U.S. Patent Publication 2006/0108636 is silent about an effect of addition of the impurity in a case where an atomic composition ratio of main component metal elements is changed.

Besides, in the TFT described in "Journal of Non-Crystalline Solids 352 (2006) 2311", field effect mobility is 10 $cm^2$/Vs to 140 $cm^2$/Vs and an S value is 0.09V/decade to 5.6V/decade depending on a material of a gate insulation film.

However, according to the knowledge of the present inventors, in the relevant TFT, since environmental stability of an In—O film formed at room temperature is low, the resistivity of the In—O film significantly changes if it is left in atmosphere. For example, if the In—O film is left in atmosphere at temperature 20° C. and humidity 50% for one month, deterioration of the resistivity from one digit to two digits is observed. Also, such deterioration of resistivity is similarly observed in an oxide semiconductor using Zn—O as a main component described in Japanese Patent Application Laid-Open No. 2002-076356.

The present invention aims to solve such problems as described above, and an object thereof is to provide an amorphous oxide excellent in transistor characteristics such as field effect mobility, an S value and the like, excellent in environmental stability, and having a large atomic composition ratio margin (design flexibility), and aims to provide a filed effect TFT having the relevant amorphous oxide.

DISCLOSURE OF THE INVENTION

The present inventors earnestly studied and have brought the present invention to completion. Namely, the present invention is characterized by an amorphous oxide, wherein the amorphous oxide includes In, Zn, N and O, an atomic composition ratio of N to N and O (N/(N+O)) in the amorphous oxide is equal to or larger than 0.01 atomic percent (at. %) and equal to or smaller than 3 at. %, and the amorphous oxide does not include Ga, or, in a case where the amorphous oxide includes Ga, the number of Ga atoms contained in the amorphous oxide is smaller than the number of N atoms.

Further, the present invention is characterized by a field effect transistor, wherein a channel layer of the field effect transistor is composed of an amorphous oxide including In, Zn, N and O, an atomic composition ratio of N to N and O (N/(N+O)) in the amorphous oxide is equal to or larger than 0.01 at. % and equal to or smaller than 3 at. %, and the amorphous oxide does not include Ga, or, in a case where the amorphous oxide includes Ga, the number of Ga atoms contained in the amorphous oxide is smaller than the number of N atoms.

According to the present invention, it is possible to acquire an amorphous oxide which is excellent in a semiconductor characteristic.

Further, according to the present invention, it is possible to provide a filed effect transistor which is excellent in transistor characteristics such as field effect mobility, an S value and the like, and excellent in environmental stability.

Furthermore, according to the present invention, it is possible to provide a field effect transistor in which a change of the transistor characteristic due to an atomic composition ratio of component atoms (in particular, metals) is small, and which has a large atomic composition ratio margin (design flexibility).

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate the embodiments of the invention and, together with the description, serve to explain the principles of the invention.

BEST MODE FOR CARRYING OUT THE INVENTION

To begin with, a background of reaching the completion of the present invention will be described before describing embodiments of the present invention.

In "Nature, Vol. 432, 25 Nov. 2004 (488-492)", a technology of using an amorphous oxide having the atomic composition ratio of In:Ga:Zn=1.1:1.1:0.9 (at. %) to a channel layer of a TFT is mentioned.

The present inventors form an In—Ga—Zn—O film at the room temperature by a sputtering method, and when the transistor characteristic of that formed film is evaluated, a transistor excellent in the initial characteristic can be obtained by reducing an atomic composition ratio of Ga (gallium). Especially, in a case that the Ga is not contained in an oxide thin film, a transistor having the large field effect mobility and a small S value can be obtained. Here, in the present invention, the above-mentioned S value means the change in the gate voltage required to change the drain current by an order of magnitude under a state of the constant drain voltage.

On the other hand, it was understood that there is a problem that a design range (a range of atomic composition ratio which can be applied to a transistor) of atomic composition ratios of In (indium) and Zn (zinc) becomes smaller by reducing the atomic composition ratio of Ga. For example, when an atomic composition ratio of Ga to In, Ga and Zn (Ga/(In+Ga+Zn)) is 30 at. %, an excellent transistor operation is exhibited within a range that an atomic composition ratio of In to In and Zn (In/(In+Zn)) is equal to or larger than 10 at. % and equal to or less than 60 at. %. On the other hand, when the atomic composition ratio of Ga is 0 at. %, a range of the atomic composition ratio of In to In and Zn (In/(In+Zn)) exhibited an excellent transistor operation becomes a narrow range that is equal to or larger than 30 at. % and equal to or less than 60 at. %. In a range of the atomic composition ratio other than the above-mentioned range, there occurs a phenomenon that a comparatively large current flows also when the negative gate bias voltage is applied, and a current on/off ratio equal to or larger than $10^5$ can not be obtained.

In addition, depending on the atomic composition ratio of Ga, the environmental stability of an oxide film varies. When the above-mentioned atomic composition ratio of Ga in a film becomes larger, the temporal change of resistivity when an oxide film is statically left in atmosphere becomes smaller. According to the knowledge of the present inventors, this variation of resistivity is an effective parameter as a barometer to the environmental stability, and the resistivity and the electric characteristic are in such a relationship that when the variation of resistivity becomes smaller, also the electric characteristic other than the resistivity of the oxide film is stabilized.

That is, with respect to the TFT characteristic, it is preferable that the atomic composition ratio of Ga becomes smaller. However, with respect to the environmental stability, it is preferable that the atomic composition ratio of Ga becomes larger.

Hence, in order to realize an oxide semiconductor having both the excellent characteristic and the environmental stability, the present inventors added various elements to an In—Zn—O film and measured the transistor characteristic and the temporal change of resistivity. As a result, by adding N (nitrogen) in a manner that the N become a specific atomic composition ratio, a fact that the environmental stability is improved while maintaining the transistor characteristic similar to the characteristic of the In—Zn—O film was found.

Figure 1:
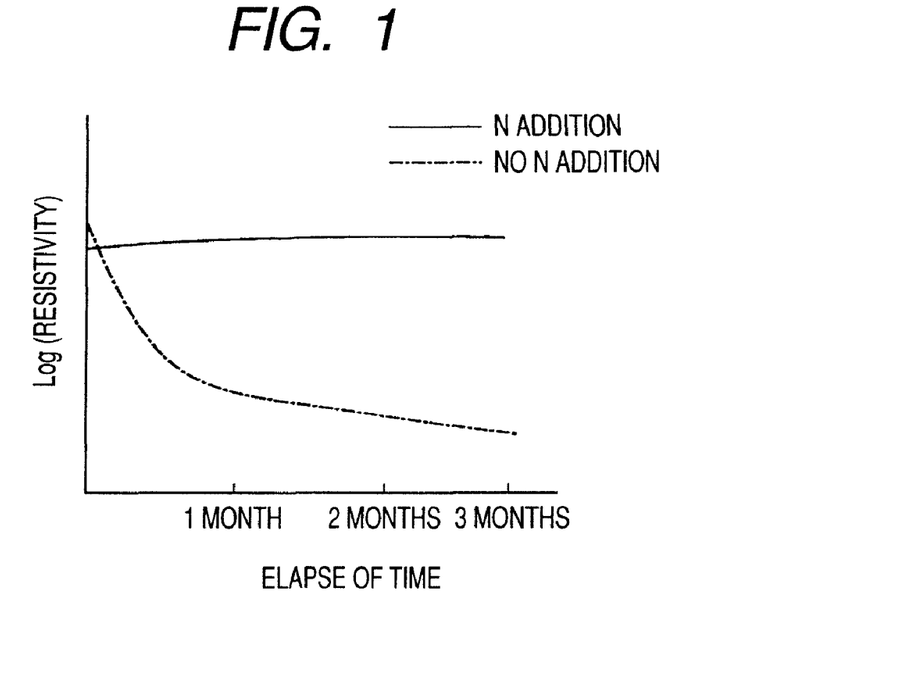
FIG. 1 is a graph indicating the temporal change of resistivity when an oxide film according to the present invention was left in atmosphere at the temperature 20° C. and the humidity 50%.

FIG. 1 is a graph indicating the temporal change of resistivity when the In—Zn—O film was left in atmosphere at the temperature of 20° C. and the humidity of 50%. In the In—Zn—O film to which N is not added, the reduction of resistivity is observed just after forming a film. Especially, in a range of an atomic composition ratio of In equal to or larger 60 at. % and equal to or less than 30 at. %, the environmental stability is in a low level, and this stability is reduced about from one digit to three digits depending on the atomic composition ratio.

Figure 2:
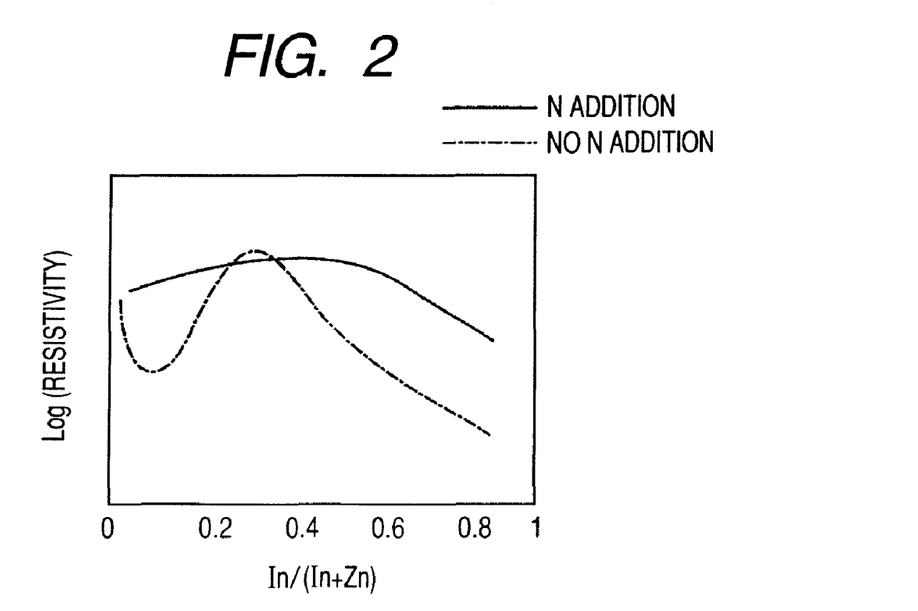
FIG. 2 is a graph of plotting the resistivity after the temporal change for different metal compositions concerning the oxide film according to the present invention.

On the other hand, in the In—Zn—O film to which N was slightly added, the variation of resistivity is not almost observed after leaving that film for three months not depending on an atomic composition ratio of that film. FIG. 2 is a graph of plotting the resistivity after statically leaving the In—Zn—O film for three months against different atomic composition ratios.

Although a cause of improving the environmental stability by the addition of N is not obvious, it is considered as below. Since it is said that the conductivity of an oxide film varies by the humidity in storage atmosphere, it is considered that the humidity resistance is improved by introducing the N. The reason of the above will be mentioned in the following.

For example, it has been known that the atomic distance is comparatively large and the diffusion coefficient of $H_2O$ is high in $SiO_2$. And, it is considered that a dipole moment of $H_2O$ becomes larger particularly in an oxide film. It is considered that the increase of the dipole moment of $H_2O$ makes to increase the generation probability of $OH^-$ ions and $H^+$ ions in an oxide film, and as a result, the change in conductivity was caused. On the other hand, in an oxynitride film (an N-added oxide film), the atomic distance is small as compared with that in the oxide film, and the diffusion coefficient of $H_2O$ is low. With such a reason, it is considered that the humidity resistance is improved by introducing the N into a film. It is considered that this improvement of the humidity resistance contributes to a cause of obtained the high environmental stability in the oxide film of the present invention.

By adding a slight amount of N, a design range (a range of atomic composition ratio which can be applied to a transistor) of an atomic composition ratios of In and Zn becomes larger. Concretely, an excellent transistor operation is exhibited within a range that an atomic composition ratio of In to the In and Zn (In/(In+Zn)) is equal to or larger than 15 at. % and equal to or less than 75 at. %.

According to the knowledge of the present inventors, when a level of the resistivity of a semiconductor composed of the amorphous oxide becomes higher, a level of an off-current flow becomes lower, and a current does not flow when the gate voltage is not applied, that is, so called a "normally-off characteristic" is exhibited. Due to the expansion of a design range of the atomic composition ratio by the addition of N, the resistance temporal change (lowering the resistance) in an In-rich region (In: equal to or larger than 60 at. %) and a Zn-rich region (Zn: equal to or larger than 70 at. %) having the low environmental stability can be suppressed.

The present invention has been completed on the basis of the foregoing knowledge.

Hereinafter, the embodiments of the present invention will be described in further detail with reference to the attached drawings.

Figure 3:
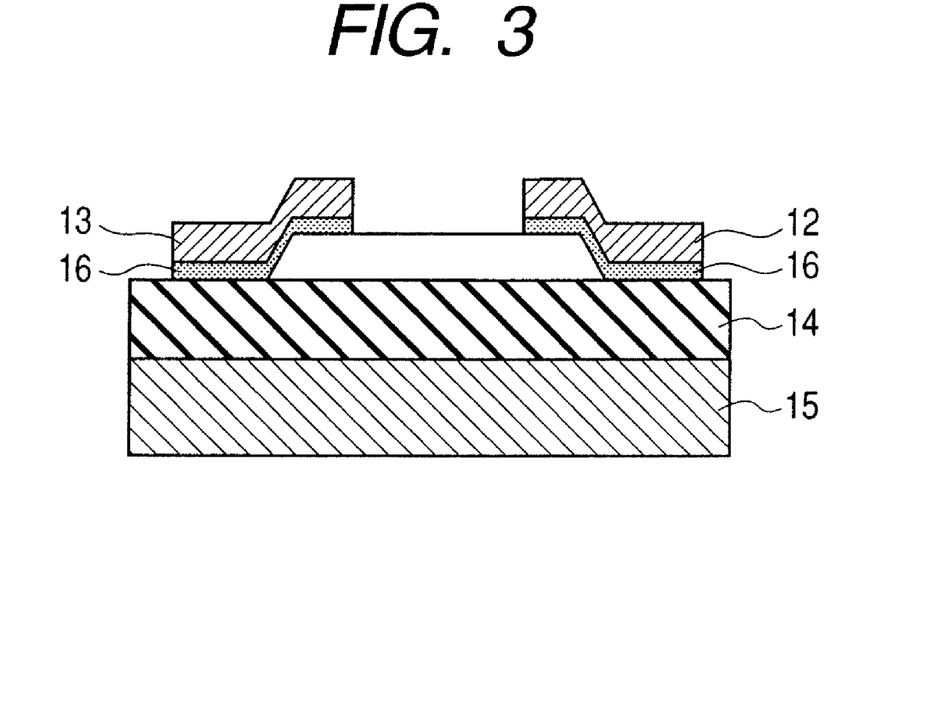
FIG. 3 is a cross-sectional view schematically indicating a structural example of a thin film transistor as an embodiment of the present invention.

FIG. 3 is a schematic diagram of the TFT device structure according to the present embodiment. A TFT is constituted by providing a gate insulation film 14 on a gate electrode 15 and providing a source electrode 12 and a drain electrode 13 on the gate insulation film 14. The gate electrode 15 may be such an electrode which serves as a substrate like the phosphorus doped Si and may be formed on a glass substrate or the like. Incidentally, adhesive layers 16 are provided between the gate insulation film 14 and the respective electrodes as illustrated in FIG. 3.

Figure 4:
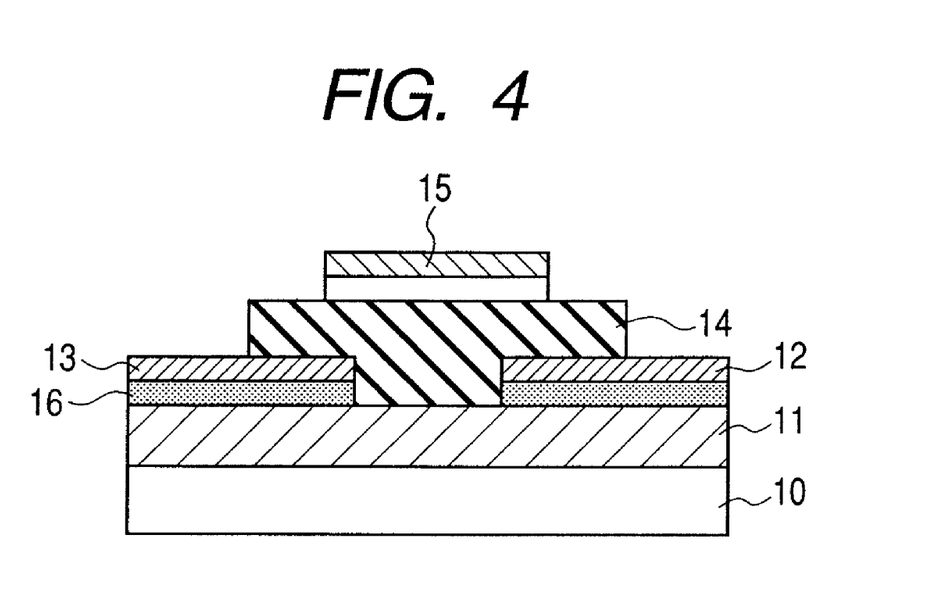
FIG. 4 is a cross-sectional view schematically indicating a structural example of a thin film transistor as an embodiment of the present invention.

The constitution of a semiconductor device which can be applied to the present embodiment is not limited to a TFT of the inverse staggered (bottom gate type) structure but may be, for example, a TFT of the staggered (top gate type) structure having a gate insulation film and a gate electrode in this order on a channel layer 11 as indicated in FIG. 4.

An oxide which contains In and Zn and a slight amount of N can be applied to a channel layer of the TFT of the present invention. Especially, when an atomic composition ratio of N to the N and O (N/(N+O)) in an amorphous oxide is equal to or larger than 0.01 at. %, a level of the humidity resistance becomes higher. And, a TFT excellent in the temporal stability can be obtained by using the above oxide to a channel layer of the TFT.

Figure 5:
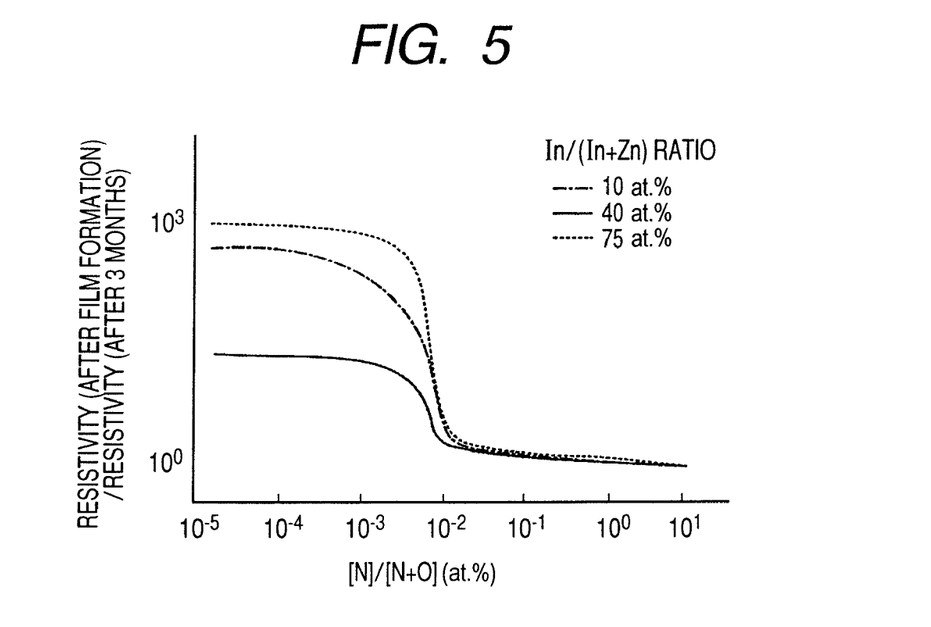
FIG. 5 is a graph of plotting magnitude of the resistivity variation concerning the oxide film according to the present invention.

FIG. 5 is a graph of plotting magnitude of the resistivity variation in the N concentration in different films. Concretely, the graph indicates values obtained by dividing the resistivity just after forming an amorphous oxide film formed with the different N concentration (atomic composition ratio) by the resistivity after statically leaving it for three months in atmosphere. Judging from FIG. 5, it is understood that variation of the resistivity is rarely observed in a film composed of an amorphous oxide of which an atomic composition ratio of N is equal to or larger than 0.01 at. %.

In addition, according to the knowledge of the present inventors, when an atomic composition ratio of N to the total amount of In and Zn (N/(In+Zn)) is small, it becomes difficult to obtain a semi-insulating film. As a result, the excellent TFT characteristic can not be obtained. Concretely, when the N/(In+Zn) becomes smaller than 0.01 at. %, the off-current becomes larger, and the current on/off ratio becomes to be in a range less than three digits. For this reason, it is preferable that the N/(In+Zn) is set to equal to or larger than 0.01 at. %. Although the above-mentioned cause is not obvious, since the resistivity of a film becomes a low level, it is considered that excess carriers are generated in a film.

And, also when the ratio of N/(In+Zn) is large, the TFT characteristic is deteriorated. Concretely, when the ratio of N/(In+Zn) is larger than 7 at. %, the rise characteristic of a subthreshold region is deteriorated, and the field effect mobility becomes a level equal to or less than 5 $cm^2/Vs$. Although this cause is not obvious, when a film having a large ratio of N/(In+Zn) is fabricated, it is required to increase the pressure of the oxygen and nitrogen gases in the film formation atmosphere. According to the inspection of the present inventors, it was confirmed that the surface roughness of a film is increased in proportion to the increase of the pressure of the oxygen and nitrogen gases in the film formation atmosphere. Therefore, it is expected that the surface roughness of a film having a large ratio of N/(In+Zn) is large. It is considered that this surface roughness deteriorates an interface characteristic between a semiconductor and a gate insulation film, and as a result, the TFT characteristic is deteriorated. Judging from this result, it is preferable that an upper limit of the N/(In+Zn) is set to become a ratio equal to or less than 7 at. %.

Accordingly, a preferable range of the N/(In+Zn) is equal to or larger than 0.01 at. % and equal to or less than 7 at. %.

Here, a current on/off ratio is obtained from a ratio between a maximum value of drain current (Id) and a minimum value Id in the transfer characteristic. And, a graph of $\sqrt{Id}-Vg$ is created from a result of the transfer characteristic, and the field effect mobility is derived from the gradient of this graph.

On the other hand, according to the knowledge of the present inventors, a value of the optical bandgap also greatly depends on the N ratio in a film. Especially, when an atomic composition ratio of N (N/(N+O)) is larger than 3 at. %, the optical bandgap decreases to about 2.5 eV. Therefore, when optical transparency is required for the visible light, it is preferable that the atomic composition ratio of N is equal to or less than 3 at. %.

Accordingly, it is preferable that the atomic composition ratio of N (N/(N+O)) in the present invention is equal to or larger than 0.01 at. % and equal to or less than 3 at. %.

An amorphous thin film is formed with an atomic composition ratio of In (In/(In+Zn)) equal to or larger than 30 at. %. At this time, a TFT having a small degree of surface roughness and excellent in the interface characteristic can be realized. Especially, a TFT having a small S value and excellent in the rise characteristic of a subthreshold region can be obtained.

Note that the oxide material of the present invention is allowed to contain Ga if it is within a predetermined range and allowed not to contain Ga. When the Ga is contained, there is an effect that the resistivity of a film can be controlled by the adding amount of Ga. As a range of the contained amount of Ga contained in an amorphous oxide, when the number of Ga atoms in the oxide is smaller than the number of N atoms, it is preferable because an effect of adding the N is great. That is, both the transistor characteristic and the environmental stability equivalent level to those in a TFT using an In—Zn—O film to a channel layer can be realized. That is, in order to realize a TFT having the excellent transistor characteristic, particularly, the high mobility and a small S value, it is preferable that the number of Ga atoms contained in the amorphous oxide is smaller than the number of N atoms.

The above-mentioned oxide may contain impurities other than Ga with the degree of substantially not influencing the film characteristic such as the mobility, the carrier concentration and the optical bandgap.

The materials of a source electrode 12, a drain electrode 13 and a gate electrode 15 are not especially limited if the materials enable to realize an excellent conductivity and an electrical connection to channel layers. For example, a member serving as both a gate electrode and a substrate such as the phosphorus doped silicon substrate is also available. In addition, a tin doped indium oxide film, a transparent conductive film such as a zinc oxide and a metal film of Au, Pt, Al and Ni can be used. In addition, an adhesive layer 16 composed of Ti, Ni, Cr or the like to improve adhesiveness may be provided between a channel layer and an electrode and between a gate electrode and a gate insulation film.

As the gate insulation film 14, either an alumina (aluminum oxide) or an yttria having the high dielectric constant or a film laminating the alumina and the yttria may be used other than a silicon oxide film and a silicon nitride film which are generally used.

As a substrate 10, depending on thermal processing condition, a glass substrate, a metal substrate, a plastic substrate or a plastic film can be used.

As a forming method of a TFT channel layer of the present invention, a substrate such as the glass substrate, the plastic substrate, a PET film, a Si substrate or the like is initially prepared. Next, an oxide semiconductor is formed by vapor deposition of a sputtering method, a pulse laser evaporation method and an electron beam evaporation method or by a combination of these methods. At this time, $N_2$, $NH_3$, NO or the like is introduced in a vapor phase in accordance with the desired nitrogen concentration in a film. It is also effective to irradiate the N radical to a film by using a radical source during film formation to control the nitrogen concentration in a film.

It is also a preferable to heat treatment a fabricated oxide after the above-mentioned process. An upper limit of temperature of the heat treatment can be properly set. It is preferable that the temperature is lower than the glass transition temperature at which a substrate thermally deforms. For example, in case of a glass substrate, it is preferable that the heat treatment is performed at the temperature equal to or less than 450° C., and in case of a plastic substrate, it is preferable that the heat treatment is performed at the temperature equal to or less than 200° C. According to the above process, the electric characteristic of an oxide film is stabilized, and a semiconductor device having the higher reliability can be realized. In order to perform heat treatment effectively, it is preferable that the heat treatment is performed under a condition that the temperature in atmosphere containing either nitrogen, oxygen, moisture or carbon dioxide is set as the temperature equal to or larger than 150° C. (an upper limit of the humidity temperature is adjusted within the above-mentioned range according to a substrate to be used). Herewith, an effect that an off-current of a TFT can be further reduced is obtained.

(TFT Characteristic)

First, an evaluation index of the transistor operation characteristic will be described.

Figure 6:
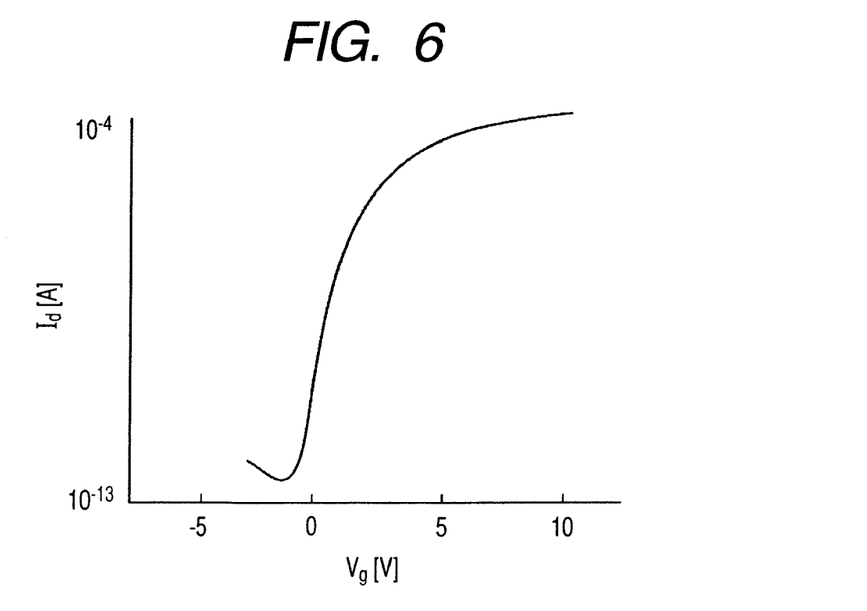
FIG. 6 is a graph indicating a typical TFT characteristic of the thin film transistor as an embodiment of the present invention.

FIG. 6 illustrates a typical characteristic of a thin film transistor of the present embodiment.

When the voltage Vd of about 6V is applied between source and drain electrodes, a current Id between the source and drain electrodes can be controlled (turned on and off) by switching a gate voltage Vg within a range from −3V and 10V.

There are various characteristics as evaluation items of the transistor characteristic, for example, the field effect mobility, a current on/off ratio and the like can be enumerated.

The field effect mobility can be obtained from the characteristic of a linear region or a saturated region. For example, a method that a graph of $\sqrt{Id}$–Vg is created from a result of the transfer characteristic and the field effect mobility is derived from the gradient of this graph can be enumerated. In the present specifications, an evaluation is performed by this method as long a description is not specifically given.

The current on/off ratio can be obtained from a ratio between the maximum Id and the minimum Id in the transfer characteristic.

In the TFT of the present embodiment, it is understood that a field effect mobility is high and an S value is small as compared with a TFT using a conventional In—Ga—Zn—O film as a channel layer. And, a design region of an atomic composition ratio (a range of an atomic composition ratio which can be applied to a transistor) of In and Zn is large. Concretely, the current on/off ratio equal to or larger than $10^5$ can be obtained within a range that an atomic composition ratio of In expressed by In/(In+Zn) is equal to or larger than 15 at. % and equal to or less than 75 at. %.

On the other hand, in a TFT using a conventional In—O film, there was a feature that the mobility is in a high level but the environmental stability is in a low level. However, in the TFT of the present embodiment, it was understood that the variations of the TFT characteristic just after fabricating the TFT and after statically leaving the TFT in atmosphere for half a year are both in a low level and an excellent characteristic with the constant stability is always exhibited.

EMBODIMENTS

Hereinafter, the present invention will be further described by using the embodiments.

Embodiment 1

A Channel Layer is an N-Added In—Zn—O Film, N/(N+O)=1.7 at. %

The Embodiment 1 of a TFT device related to the present invention will be described with reference to FIG. 4.

In the present embodiment, an ITO (indium tin oxide) is used as a gate electrode 15, and a silicon oxide film of which thickness is about 150 nm is used for a gate insulation film 14. And, a glass substrate is used for a substrate on which an N-added In—Zn—O film was formed as a channel layer 11.

In the present embodiment, a combinatorial method is used for the film formation in order to investigate the dependency of an atomic composition ratio of a channel layer. That is, this dependency is investigated by using a method that the oxide thin film including various compositions is fabricated on the one substrate at one time by a sputtering method. However, this method is not always required to use. A thin film composed of an amorphous oxide may be formed by preparing a material source (target) having the predetermined compositions, or a thin film having the desired compositions may be formed by controlling the power to be injected to each of plural targets.

The N-added In—Zn—O film was formed by using a co-sputtering apparatus with diagonal incidence configuration. The target is arranged in the oblique direction to a substrate, and since compositions of a film on the substrate varies by the difference of distance from the target, a thin film in which an extensive composition distribution of binary system elements are entirely existing inside a substrate surface can be obtained. As the target (material source), a 2-inch sintered material t having ZnO composition and a 2-inch sintered material having $In_2O_3$ composition (respectively, purity 99.9%) are used. Respective injecting RF (radio frequency) powers are 50 W for the ZnO and 30 W for the $In_2O_3$. The N (nitrogen) is supplied by the radical source. The above-mentioned radical source is excited by the electron cyclotron resonance plasma, and the injection microwave power is 80 W. In the present embodiment, the nitrogen concentration in a film is controlled by introducing the N radical generated by the radical source into the sputtering film formation atmosphere. It was set that a distance between the target and a substrate is about 7-12 cm and the substrate temperature at a time of forming a film is about 25° C. The N-added In—Zn—O film is formed in the argon-nitrogen-oxygen mixture gas atmosphere of which the pressure is $4 \times 10^{-1}$ Pa, and the partial pressure of introduced nitrogen is set as $8 \times 10^{-2}$ Pa and the partial pressure of introduced oxygen is set as $1.6 \times 10^{-2}$ Pa.

Thereafter, an ITO film having thickness of about 150 nm is formed on the oxide semiconductor channel layer by using an electron beam heating evaporation method and then the source electrode 12 and the drain electrode 13 are formed by a photolithography method and a lift-off method. At last, a $SiO_2$ film to be used as the gate insulation film 14 is deposited until its thickness becomes about 200 nm by an RF sputtering method. Subsequently, an ITO film having thickness of about 150 nm is formed on the $SiO_2$ film and then the gate electrode 15 is formed by the photolithography method and the lift-off method. The channel length is 10 μm and the channel width is 150 μm.

Next, a heat treatment is performed for the TFT fabricated by the above-mentioned method for one hour in atmosphere at the temperature 300° C. With respect to the finally obtained N-added In—Zn—O film, when the measurement is performed concerning the oxide film by using a step meter, the film thickness is about 40 nm. It is observed that an atomic composition ratio of In (In/(Zn+In)) is in a range from 15 at. % to 75 at. % by a fluorescent X-ray analysis and a Rutherford Back-Scattering (RBS) analysis and it is observed that an atomic composition ratio of N (N/(N+O)) is about 1.7 at. % by a Secondary Ion Mass Spectrometry (SIMS). An atomic composition ratio of N expressed by N/(In+Zn) is in a range from 1.9 at. % to 2.4 at. % and an atomic composition ratio of N to all the atoms is about 1 at. %.

When the measurement of an X-ray diffraction is performed under the condition that an incident angle to a film surface is 0.5°, an obvious diffraction peak is not detected when an atomic composition ratio of In (In/(In+Zn)) is equal to or larger than 30 at. %, and it is confirmed that the fabricated film is an amorphous. On the other hand, when the atomic composition ratio of In (In/(In+Zn)) is equal to or less than 30 at. %, a diffraction peak of $Zn_kIn_2O_{k+3}$ ($6 \leq K \leq 8$) is detected, and it is confirmed that the fabricated film is crystallized.

Comparative Example 1

A Channel Layer is an In—Zn—O Film

The constitution of this example is set to be similar to that in the above-mentioned Embodiment 1 excepting a channel layer. In the present comparative example, an In—Zn—O film, to which the N is not added, is formed as the channel layer 11. Note that a combinatorial method is used for film formation also in the present comparative example in order to investigate the dependency of an atomic composition ratio of the channel layer material.

The In—Zn—O film is formed in the argon-oxygen mixture gas atmosphere of which the pressure is $4 \times 10^{-1}$ Pa, and the partial pressure of introduced oxygen is set as $2 \times 10^{-3}$ Pa. In the present comparative example, the introduction of the radical into the film formation atmosphere by the radical source is not performed. Other film forming conditions are assumed to be similar to those in the above-mentioned Embodiment 1. When the measurement is performed concerning the finally obtained oxide film by using a step meter, the film thickness is about 40 nm. In addition, when the fluorescent X-ray analysis is performed, the atomic composition ratio of In (In/(Zn+In)) is in a range from 15 at. % to 75 at. %. With respect to the nitrogen amount in a film, when the evaluation is performed by using the Secondary Ion Mass Spectrometry (SIMS), it is observed that the nitrogen amount is in a range below the detection limit.

When the measurement of an X-ray diffraction is performed under the condition that an incident angle to a film surface is 0.5°, an obvious diffraction peak is not detected when an atomic composition ratio of In (In/(In+Zn)) is equal to or larger than 30 at. %, and it is confirmed that the fabricated film is an amorphous. On the other hand, when the atomic composition ratio of In (In/(In+Zn)) is equal to or less than 30 at. %, a diffraction peak of $Zn_kIn_2O_{k+3}$ ($6 \leq K \leq 8$) is detected, and it is confirmed that the fabricated film is crystallized.

Comparative Example 2

A Channel Layer is an N-Added In—Zn—O Film.
N=5 at. %

The constitution of this example is set to be similar to that in the above-mentioned Embodiment 1 excepting a channel layer. In the present comparative example, an N-added In—Zn—O film is formed as the channel layer 11. Note that a combinatorial method is used for film formation also in the present comparative example in order to investigate the dependency of an atomic composition ratio of the channel layer material.

The N-added In—Zn—O film is formed in the argon-oxygen-nitrogen mixture gas atmosphere of which the pressure is $4 \times 10^{-1}$ Pa, and the partial pressure of introduced oxygen is set as $1.6 \times 10^{-2}$ Pa and the partial pressure of nitrogen is set as $1 \times 10^{-1}$ Pa. Other film forming conditions are assumed to be similar to those in the above-mentioned Embodiment 1. When the measurement is performed concerning the obtained oxide film by using a step meter, the film thickness is about 40 nm. In addition, when the fluorescent X-ray analysis is performed, the atomic composition ratio of In (In/(Zn+In)) is in a range from 15 at. % to 75 at. %. With respect to the nitrogen amount in a film, when the evaluation is performed by using the Rutherford Back-Scattering (RBS) analysis, it is observed that the atomic composition ratio of nitrogen (N/(N+O)) is about 5 at. %.

When the measurement of an X-ray diffraction is performed under the condition that an incident angle to a film surface is 0.5°, an obvious diffraction peak is not detected when an atomic composition ratio of In (In/(In+Zn)) is equal to or larger than 32 at. %, and it is confirmed that the fabricated film is an amorphous. On the other hand, when the atomic composition ratio of In (In/(In+Zn)) is equal to or less than 32 at. %, a diffraction peak of $Zn_kIn_2O_{k+3}$ ($6 \leqq K \leqq 8$) is detected, and it is confirmed that the fabricated film is crystallized.

(Channel Layer Properties)

With respect to the N-added In—Zn—O channel layer obtained in the present embodiment, when the analysis of optical absorption spectrum is performed, the optical bandgap of the above-mentioned N-added oxide film, which depends on the atomic composition ratio of In, indicated a value within a range about from 2.7 eV to 2.9 eV. In the In—Zn—O film in the Comparative Example 1, the optical bandgap is in a range from about 2.7 eV to 2.9 eV similar to the above-mentioned range. On the other hand, the optical bandgap of the oxynitride semiconductor in the Comparative Example 2 is in a range from about 2.3 eV to 2.4 eV. As a result, it was understood that the light-receiving sensitivity in a visible range increases in proportion to the increase of the atomic composition ratio of nitrogen (N/(N+O)).

Figure 7:
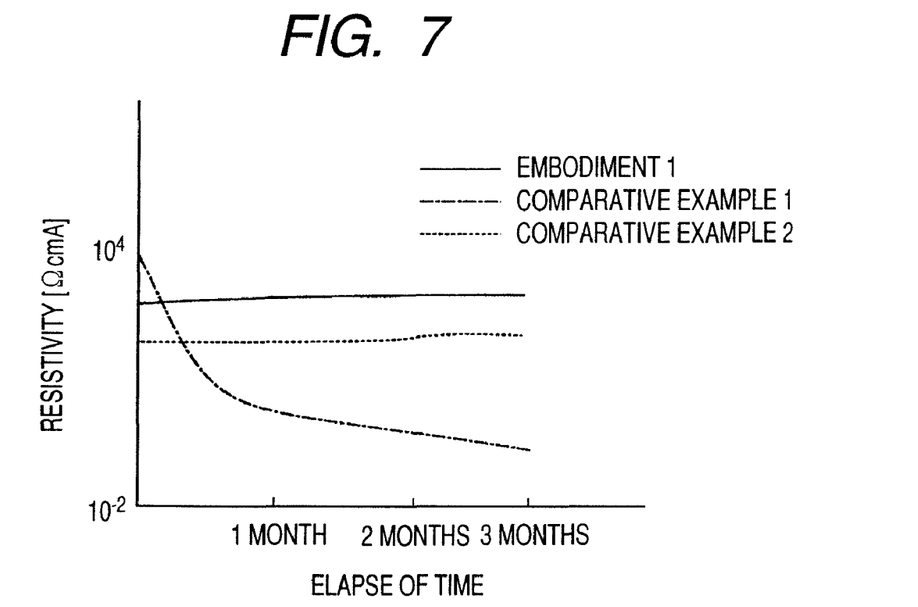
FIG. 7 is a graph indicating the temporal change of resistivity when an oxide film fabricated in the Embodiment 1 is left in atmosphere at the temperature 20° C. and the humidity 50%.

Next, in order to inspect the environmental stability of the N-added Zn—In—O film, an oxide film fabricated in the present embodiment and the oxide film fabricated in the Comparative Example 1 are statically left in atmosphere at the temperature of 20° C. and the humidity of 50%, and the temporal change of the resistivity is measured. In the In—Zn—O film of the Comparative Example 1, the decrease in the resistivity about 1-3 orders of magnitude is observed depending on the atomic composition ratios of In and Zn after statically leaving the In—Zn—O film for three months. On the other hand, in the N-added In—Zn—O films of the present embodiment and the Comparative Example 2, the variation of resistivity is not observed, and it is understood that the N-added In—Zn—O film is excellent in the environmental stability. FIG. 7 indicates the temporal change of resistivity in a case that the atomic composition ratio of In (In/(Zn+In)) is 75 at. % concerning the oxide films obtained in the present embodiment and the Comparative Example 2.

In this manner, by adding the N of suitable amount to the In—Zn—O film, a semiconductor which has the environmental stability while maintaining the transparency to the visible light can be realized.

(Characteristic Evaluation of TFT Device)

FIG. 6 indicates Id–Vg characteristic (transfer characteristic) at a voltage of Vd=6V when the TFT fabricated in the present embodiment is measured under the room temperature.

In the Embodiment 1 and the Comparative Examples 1 and 2, when the atomic composition ratio of In expressed by In/(Zn+In) is about 40 at. %, the most excellent transistor characteristic is obtained. At this time, an on-current shows a large value, and in the Embodiment 1, it is observed that a current at a level of $Id=5 \times 10^{-4}$ A flows when the voltage $V_g$ is $V_g=10V$. An off-current is in a level of $Id=8 \times 10^{-13}$ A and the threshold voltage is about 1.5V. When the field effect mobility is calculated from an output characteristic, the field effect mobility of about 15 $cm^2/Vs$ is obtained in a saturated region. And, S value is about 0.3V/decade. When the atomic composition ratio of In is about 40 at. %, the mobility and an S value of the TFT device fabricated in the Comparative Example 1 respectively exhibit values of about 17 $cm^2/Vs$ and about 0.16V/decade. From this result, it is understood that an excellent transistor characteristic can be obtained in both the Embodiment 1 and the Comparative Example 1.

Meanwhile, also in the TFT device fabricated in the Comparative Example 2, the mobility and S value respectively show comparatively excellent values of about 15 $cm^2/Vs$ and 0.5V/decade. However, the off-current increases by irradiating the light of a fluorescent lamp, and as a result, it is observed that a current on/off ratio becomes smaller than five-digit level.

Figure 8:
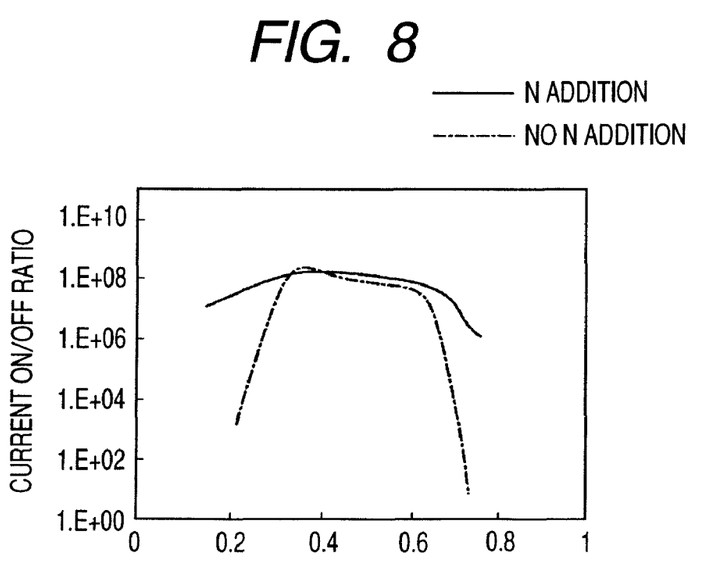
FIG. 8 is a graph of plotting current on/off ratios after leaving the TFTs fabricated in the Embodiment 1 in atmosphere at the temperature 20° C. and the humidity 50% for half a year.

Next, in order to inspect the environmental stability of the TFT device, that TFT device is statically left in atmosphere at the temperature of 20° C. and the humidity of 50%, and the temporal change of TFT characteristic is measured. As a result, in the TFTs fabricated in the Embodiment 1 and the Comparative Example 2, the variation of characteristics can not be found after statically leaving the TFTs regardless of the atomic composition ratios of In and Zn, and it is indicated that the TFTs are excellent in the environmental stability. On the other hand, in the TFT fabricated in the Comparative Example 1, when the atomic composition ratio of In (In/(Zn+In) is equal to or less than 30 at. % and equal to or larger than 60 at. %, the off-current greatly increases with time. As a result, a sufficient current on/off ration is not obtained with the above-mentioned atomic composition ratio of In. From this relationship, it is understood that a design range (a range of atomic composition ratio which can be applied to a transistor) of the atomic composition ratio of In:Zn is in a small range in the TFT of the Comparative Example 1. FIG. 8 is a graph of plotting a current on/off ratio of the TFT after statically leaving that TFT for half a year with respect to the Embodiment 1 and the Comparative Example 1.

In this manner, by using the N-added In—Zn—O film for a channel layer, a TFT device, which is excellent in a transistor characteristic such as the mobility, S value and the environmental stability, having a large atomic composition ratio margin (design flexibility) can be realized. Furthermore, a TFT device having high transparency to the visible light can be realized by selecting suitable concentration of N in a film.

Embodiment 2

A Channel Layer is an In—Zn—Ga—O Film, N/(N+O)=2 at. %

The Embodiment 2 of a TFT device according to the present invention will be described by using FIG. 4.

In the present embodiment, an ITO (indium tin oxide) is used as the gate electrode 15, and a silicon oxide film of which thickness is about 150 nm is used for the gate insulation film 14. A glass substrate is used for a substrate on which an N-added In—Zn—Ga—O film is formed as the channel layer 11.

The In—Zn—Ga—O film is formed by using a co-sputtering apparatus with diagonal incidence configuration similar to the Embodiment 1. In the present embodiment, since a film is formed with use of ternary materials of $In_2O_3$, ZnO and $InGaZnO_4$, the In—Zn—Ga—O thin film, which has a distribution of the atomic composition ratio of which Ga ratio is equal to or larger than 0.4 at. % and equal to or less than 5 at. % in a surface of one substrate, can be obtained. At this time, the Ga concentration distribution is formed in the direction orthogonal to the compositional gradient of In—Zn.

As the target (material source), a 2-inch sintered material having the ZnO composition, a 2-inch sintered material having the $In_2O_3$ composition and a 2-inch sintered material having the $InGaZnO_4$ composition (respectively, purity 99.9%) are used. Respective injecting RF (radio frequency) powers are 50 W for ZnO, 30 W for $In_2O_3$ and 35 W for $InGaZnO_4$. The N (nitrogen) is supplied by the radical source. The above-mentioned radical source is excited by the electron cyclotron resonance plasma, and the injecting microwave power is 80 W. In the present embodiment, the nitrogen concentration in a film is controlled by introducing the N radical generated by the radical source into the deposition atmosphere. It is set that a distance between the target and a substrate is about 7-12 cm and the substrate temperature at a time of forming a film is 25° C. The N added In—Zn—Ga—O film is formed in the argon-nitrogen-oxygen mixture gas atmosphere of which the pressure is $4\times10^{-1}$ Pa, and the partial pressure of introduced nitrogen is set at $1\times10^{-1}$ Pa and the partial pressure of introduced oxygen is set at $9\times10^{-2}$ Pa.

Thereafter, an ITO film having thickness of about 150 nm is formed on a semiconductor channel layer composed of an amorphous oxide by using an electron beam heating evaporation method. Next, the source electrode 12 and the drain electrode 13 are formed by the photolithography method and the lift-off method. At last, a $SiO_2$ film to be used as the gate insulation film 14 is deposited until its thickness becomes about 200 nm by an RF sputtering method. Subsequently, an ITO film having thickness of about 150 nm is formed on the $SiO_2$ film and then the gate electrode 15 is formed by the photolithography method and the lift-off method. The channel length is 10 μm and the channel width was 150 μm.

Next, a heat treatment is performed on the TFT fabricated by the above-mentioned method for one hour in atmosphere at the temperature of 300° C. The thickness of N-added In—Zn—Ga—O film is about 40 nm, which is measured by step meter. It is confirmed that an atomic composition ratio of In (In/(Zn+In)) is in a range from 15 at. % to 75 at. % and an atomic composition ratio of N (N/(N+O)) is about 2 at. % by the fluorescent X-ray analysis, the Rutherford Back-Scattering (RBS) analysis and the SIMS (Secondary Ion Mass Spectrometry). And, it is observed that an atomic composition ratio of Ga and an atomic composition ratio of N to all the atoms are respectively about from 0.4 at. % to 5 at. % and about 1.2 at. %. The atomic composition ratio of N expressed by N/(In+Zn) is in a range from 2.2 at. % to 2.9 at. %.

When the measurement of an X-ray diffraction is performed under the condition that an incident angle to a film surface is 0.5°, an obvious diffraction peak is not detected when an atomic composition ratio of Zn (Zn/(In+Zn+Ga)) is equal to or larger than 70 at. %, and it is confirmed that the fabricated film is an amorphous. On the other hand, when the atomic composition ratio of Zn (Zn/(In+Zn+Ga)) is equal to or less than 70 at. %, a diffraction peak of $Zn_kIn_2O_{k+3}$ ($6\leq K \leq 8$) is detected, and it is confirmed that the fabricated film is crystallized.

Comparative Example 3

A Channel Layer is an In—Zn—Ga—O Film

The constitution of this example is set to be similar to that in the above-mentioned Embodiment 2 excepting a channel layer. In the present comparative example, an In—Zn—Ga—O film, to which the N is not added, is formed as the channel layer 11. Note that a combinatorial method is used for film formation also in the present comparative example in order to investigate the dependence of the atomic composition ratio of the channel layer material.

The In—Zn—Ga—O film is formed in the argon-oxygen mixture gas atmosphere of which the pressure is $4\times10^{-1}$ Pa, and the partial pressure of introduced oxygen is set as $8\times10^{-4}$ Pa. In the present comparative example, the introduction of the radical into the film formation atmosphere by the radical source is not performed. Other film forming conditions are assumed to be similar to those in the above-mentioned Embodiment 2. The thickness of oxide film, which is measured is by using a step meter, is about 40 nm. In addition, from the fluorescent X-ray analysis, the RBS (Rutherford Back-Scattering) analysis and the SIMS (Secondary Ion Mass Spectrometry), it is observed that the atomic composition ratio of In (In/(Zn+In)) is in a range from 15 at. % to 75 at. % and the atomic composition ratio of Ga to all the atoms is in a range about from 0.4 at. % to 5 at. %. With respect to the nitrogen amount in a film, when the evaluation is performed by using the Secondary Ion Mass Spectrometry (SIMS), it is observed that the nitrogen amount is in a range below the detection limit.

When the measurement of an X-ray diffraction is performed under the condition that an incident angle to a film surface is 0.5°, an obvious diffraction peak is not detected when an atomic composition ratio of Zn (Zn/(In+Zn+Ga)) is equal to or larger than 70 at. %, and it is confirmed that the fabricated film is an amorphous. On the other hand, when the atomic composition ratio of Zn (Zn/(In+Zn+Ga)) is equal to or less than 70 at. %, a diffraction peak of $Zn_kIn_2O_{k+3}$ ($6\leq K \leq 8$) is detected, and it is confirmed that the fabricated film is crystallized.

(Channel Layer Properties)

The analysis of optical absorption spectrum is performed on the N-added In—Zn—Ga—O channel layer obtained in the present embodiment. As a result, the optical bandgap of the above-mentioned N-added oxide film, which depends on the atomic composition ratio of metal, shows a value within a range about from 2.8 eV to 3.1 eV. This result indicates a value which is slightly larger than that of the N-added In—Zn—O film in the Embodiment 1 and similar to that of the In—Zn—Ga—O film in the Comparative Example 3.

The 4-probe measurement is performed on the N-added In—Zn—Ga—O film obtained in the present embodiment. As a result, it is observed that the resistivity greatly varies depending on an amount of Ga. For example, when the atomic composition ratio of In (In/(Zn+In)) is 75 at. %, a resistivity is about 300 Ω·cm when the compositional ratio of Ga to the number of all atoms is 0 at. % (Embodiment 1). On the other hand, it is observed that a resistivity value increases to about 2.4 kΩ·cm and increases to about 30 kΩ·cm at the compositional ratio of Ga to all atoms of 0.45 at. % and 5 at. %, respectively. The above-mentioned pattern is similarly observed also in the In—Zn—Ga—O film fabricated in the Comparative Example 3, and it is indicated that the resistivity can be controlled by the adding amount of Ga.

Figure 9:
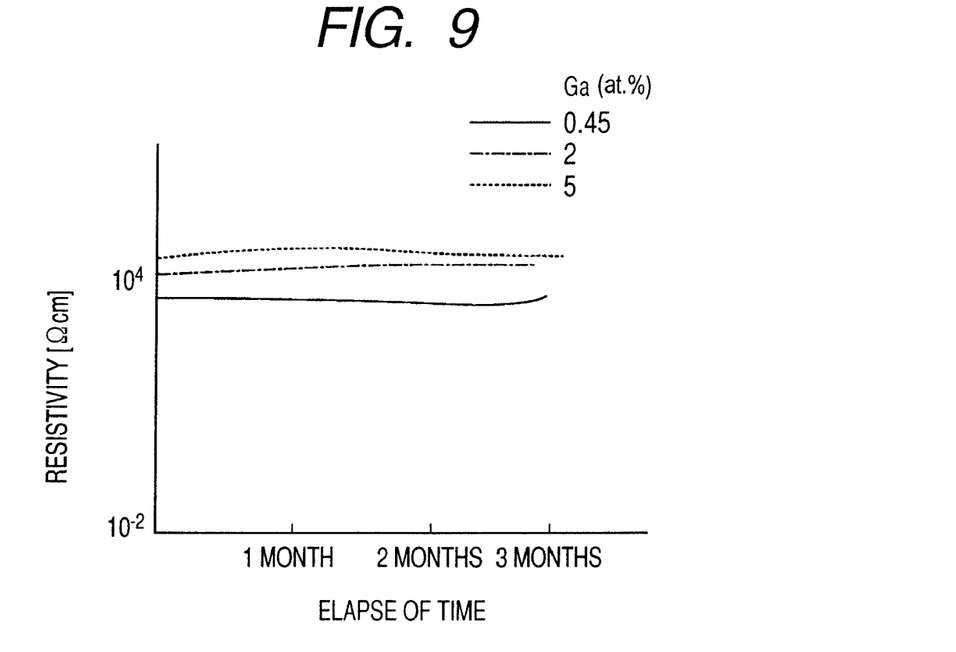
FIG. 9 is a graph indicating the temporal change of resistivity when an oxide film fabricated in the Embodiment 2 is left in atmosphere at the temperature 20° C. and the humidity 50%.
Figure 10:
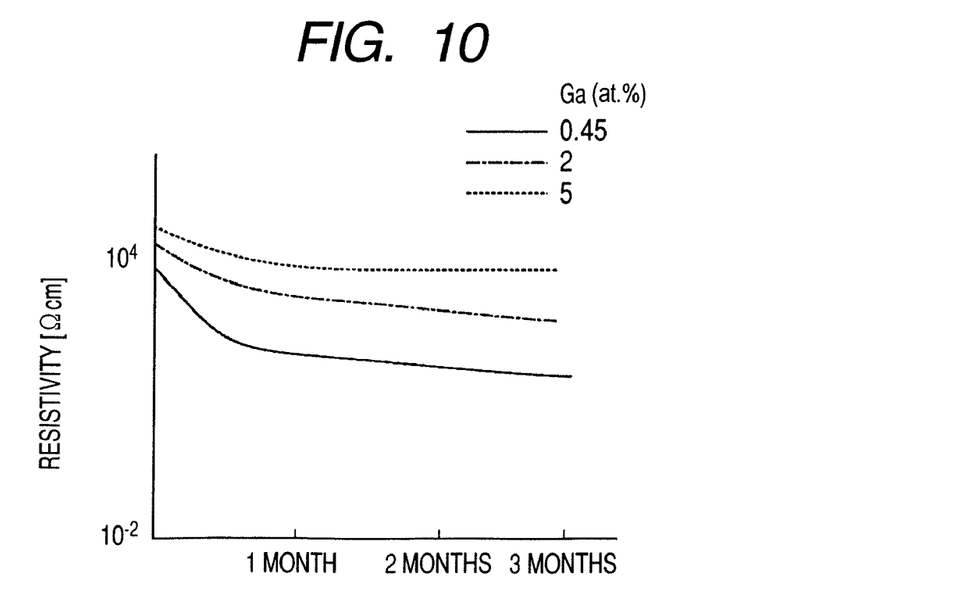
FIG. 10 is a graph indicating the temporal change of resistivity when an oxide film fabricated in the Comparative Example 3 is left in atmosphere at the temperature 20° C. and the humidity 50%.

Next, in order to inspect the environmental stability of the In—Zn—Ga—O film, an N-added oxide film fabricated in the present embodiment and an oxide film fabricated in the Comparative Example 3 are statically, left in atmosphere at the temperature 20° C. and the humidity 50%, and the temporal change of the resistivity is measured. FIGS. 9 and 10 are graphs which indicates a result of the above-mentioned measurement and the temporal change of the resistivity when an atomic composition ratio of In (In/(Zn+In)) is 75 at. % with respect to the oxide films obtained in the present embodiment and the comparative example.

As a result of the above inspection, in the N-added In—Zn—Ga—O film of the present Embodiment 2, the variation of resistivity is not observed, and it is understood that this film is excellent in the environmental stability. Meanwhile, the temporal change amount of the In—Zn—Ga—O film of the Comparative Example 3 is also small as compared with that of the In—Zn—O film of the Comparative Example 1, and it is confirmed that the introduction of Ga into a film gives an effect to the improvement of the environmental stability. However, in the N-added oxide film of the present Embodiment 2, both the resistivity after the film formation and the resistivity after statically leaving that film for three months hardly exhibited the variation. On the other hand, in the oxide film of the Comparative Example 3, when the atomic composition ratio of Ga is equal to or less than 1 at. %, the deterioration of resistivity in a range from one digit to two digits is observed, and it is understood that the N-added oxide film of the Embodiment 2 is more excellent regarding the environmental stability.

In this manner, by adding both Ga and N to the In—Zn—O film, a semiconductor excellent in the controllability of resistivity and having the high environmental stability can be realized.

(Characteristic Evaluation of TFT Device)

In the Embodiment 2, when the atomic composition ratio of In (In/(Zn+In)) is about 40 at. % and the atomic composition ratio of Ga to the number of all atoms is 0.4 at. %, the most excellent transistor characteristic is obtained. At this time, an on-current exhibits a comparatively large value, and it is understood that a current at a level of Id=$4 \times 10^{-4}$A flows when the voltage $V_g$ is in a level of $V_g$=10V. An off-current is in a level of Id=$1 \times 10^{-13}$A and the threshold voltage is about 2.3V, and it is observed that the off-current is in a low level and the threshold voltage is in a high level as compared with a case in the Embodiment 1. And, at this time, the TFT exhibits the normally-off characteristic. When the field effect mobility and S value are calculated from an output characteristic, excellent characteristics such as about 14.4 cm$^2$/Vs and about 0.3V/decade respectively which are almost similar to the values obtained in the Embodiment 1 are obtained. The above-mentioned result is observed also in the TFT fabricated in the Comparative Example 3, and it is understood that a low level off-current or the normally-off characteristic can be realized while maintaining the high field effect mobility by adding a slight amount of Ga.

Figure 11:
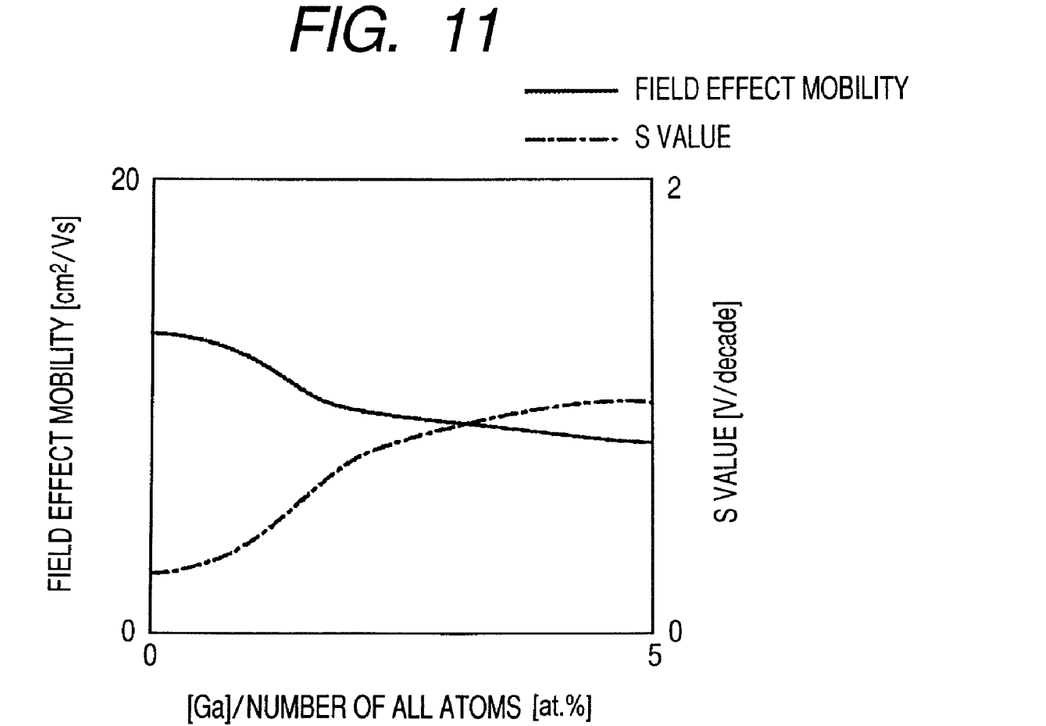
FIG. 11 is a graph of plotting the field effect mobility and an S value (the change in the gate voltage required to change the drain current by an order of magnitude.) for different atomic composition ratios of Ga (gallium) in a TFT fabricated in the Embodiment 2.

However, if the atomic composition ratio of Ga is further increased, the above-mentioned characteristics are deteriorated. For example, it is observed that when an atomic composition ratio of Ga to the number of all atoms is 2 at. %, the field effect mobility becomes about 12 cm$^2$/Vs and the S value becomes about 0.7V/decade and when the atomic composition ratio of Ga is 5 at. %, the field effect mobility becomes about 10 cm$^2$/Vs and the S value becomes about 1V/decade. In FIG. 11, the field effect mobility and S values for the different atomic composition ratios of Ga are plotted. Note that an atomic composition ratio of In (In/(Zn+In)) is about 40 at. % in FIG. 11. From this FIG. 11, it is clarified that the TFT characteristic is deteriorated when the atomic composition ratio of Ga to the number of all atoms is about equal to or larger than 1 at. %, that is, when it becomes larger than the atomic composition ratio of N to the number of all atoms.

Next, in order to inspect the environmental stability of the TFT device, that TFT device is statically left in atmosphere at the temperature of 20° C. and the humidity of 50%, and the temporal change of TFT characteristic is measured. As a result, in the TFT fabricated in the Embodiment 2, the variation of characteristic is not seen after statically leaving the TFT for half a year regardless of the atomic composition ratios of In and Zn, and it is found that the TFT is excellent in the environmental stability. On the other hand, although the TFT fabricated in the Comparative Example 3 is also excellent in the environmental stability, the increase of an off-current is observed when the atomic composition ratio of Ga is equal to or less than 1 at. %. Especially, when the atomic composition ratio of In (expressed by In/(Zn+In)) is equal to or larger than 70 at. %, it is observed that the off-current increases to a level of about double amount.

In conclusion, by using the N-added In—Zn—Ga—O film of which the atomic composition ratio of Ga is smaller than that of N (that is, the number of Ga atoms is less than the number of N atoms) for a channel layer, TFT device excellent in the transistor characteristic and the environmental stability can be obtained.

In addition, by adding both Ga and N, TFT device having the high controllability of an off-current, a threshold voltage and excellent in the environmental stability can be realized.

Incidentally, it should be noted that a constitution acquired by combining the above embodiments and their modifications is completely included in the present invention.

While the present invention has been described with reference to what is presently considered to be the preferred embodiments, it is to be understood that the present invention is not limited to the disclosed embodiments. In such a meaning, the above embodiments are merely exemplifications of the present invention.

It should be noted that the technical concept of the present invention should be defined by the appended claims, but should not be limitedly interpreted by only the description of the specification.

Moreover, it should be noted that any adjustment and modification not departing from the scope of the technical concept described in the appended claims constitute the technical concept of the present invention.

This application claims the benefit of Japanese Patent Application No. 2007-143431, filed May 30, 2007, which is hereby incorporated by reference herein in its entirety.

The invention claimed is:

1. An amorphous oxide, wherein
the amorphous oxide includes In, Zn, N and O,
an atomic composition ratio of N to N and O (N/(N+O)) in the amorphous oxide is equal to or larger than 0.01 atomic percent and equal to or smaller than 3 atomic percent,
an atomic composition ratio of N to a sum of In and Zn (N/(In +Zn)) in the amorphous oxide is equal to or larger than 0.01 atomic percent and equal to or smaller than 7 atomic percent,
an atomic composition ratio of In to In and Zn (In/(In +Zn)) in the amorphous oxide is equal to or larger than 15 atomic percent and equal to or smaller than 75 atomic percent, and
the amorphous oxide does not include Ga, or, in a case where the amorphous oxide includes Ga, the number of Ga atoms contained in the amorphous oxide is smaller than the number of N atoms.

2. The amorphous oxide according to claim 1, wherein the atomic composition ratio of In to In and Zn (In/(In +Zn)) in the amorphous oxide is equal to or larger than 30 atomic percent.

3. The amorphous oxide according to claim 1, wherein the atomic composition ratio of Zn to In, Zn and Ga (Zn/(In+Zn+Ga)) in the amorphous oxide is equal to or larger than 70 atomic percent.

4. The amorphous oxide according to claim 1, wherein the atomic composition ratio of Ga to the number of all atoms in the amorphous oxide is equal to or smaller than 5 atomic percent.

5. A field effect transistor, wherein
a channel layer of the field effect transistor is composed of an amorphous oxide including In, Zn, N and O,
an atomic composition ratio of N to N and O (N/(N+O) in the amorphous oxide is equal to or larger than 0.01 atomic percent and equal to or smaller than 3 atomic percent, an atomic composition ratio of N to a sum of In and Zn (N/In +Zn) in the amorphous oxide is equal to or larger than 0.01 atomic percent and equal to or smaller than 7 atomic percent, an atomic composition ratio of In to In and Zn (In/(In +Zn)) in the amorphous oxide is equal to or larger than 15 atomic percent and equal to or smaller than 75 atomic percent, and the amorphous oxide does not include Ga, or, in a case where the amorphous oxide includes Ga, the number of Ga atoms contained in the amorphous oxide is smaller than the number of N atoms.

6. The field effect transistor according to claim 5, wherein the atomic composition ratio of In to In and Zn (In/(In +Zn)) in the amorphous oxide is equal to or larger than 30 atomic percent.

7. The field effect transistor according to claim 5, wherein the atomic composition ratio of Zn to In, Zn and Ga (Zn/(In +Zn+Ga)) in the amorphous oxide is equal to or larger than 70 atomic percent.

8. The field effect transistor according to claim 5, wherein the atomic composition ratio of Ga to the number of all atoms in the amorphous oxide is equal to or smaller than 5 atomic percent.

* * * * *